(12) United States Patent
Min

(10) Patent No.: US 9,784,797 B2
(45) Date of Patent: Oct. 10, 2017

(54) METHOD FOR CONTROLLING AND AN ELECTRONIC DEVICE THEREOF

(71) Applicant: Samsung Electronics Co., Ltd., Gyeonggi-do (KR)

(72) Inventor: Sun-Young Min, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 195 days.

(21) Appl. No.: 14/597,022

(22) Filed: Jan. 14, 2015

(65) Prior Publication Data

US 2015/0198676 A1    Jul. 16, 2015

(30) Foreign Application Priority Data

Jan. 14, 2014  (KR) .................. 10-2014-0004660

(51) Int. Cl.
| | |
|---|---|
| *H02J 7/00* | (2006.01) |
| *G01R 31/36* | (2006.01) |
| *H01F 38/14* | (2006.01) |
| *H02J 7/02* | (2016.01) |

(52) U.S. Cl.
CPC ..... *G01R 31/3679* (2013.01); *G01R 31/3606* (2013.01); *H01F 38/14* (2013.01); *H02J 7/0057* (2013.01); *H02J 7/025* (2013.01); *G01R 31/3651* (2013.01); *H02J 2007/0062* (2013.01)

(58) Field of Classification Search
CPC ........................................... H02J 7/00
USPC ................................. 320/107, 109
See application file for complete search history.

(56) References Cited

U.S. PATENT DOCUMENTS

| | | | |
|---|---|---|---|
| 8,588,867 B2 | 11/2013 | Lee et al. | |
| 2008/0119982 A1 | 5/2008 | Yamada | |
| 2013/0073507 A1* | 3/2013 | Sera ................ | B60L 11/1861 706/46 |

FOREIGN PATENT DOCUMENTS

| | | |
|---|---|---|
| EP | 2610701 A1 | 7/2013 |
| JP | 2007-198994 | 8/2007 |
| JP | 2007-255987 | 10/2007 |
| KR | 10-2005-0028764 | 3/2005 |
| KR | 10-2009-0075129 | 7/2009 |
| KR | 10-2012-0102446 | 9/2012 |

OTHER PUBLICATIONS

Extended European Search Report dated Jun. 11, 2015 in connection with European Application 15150898.3; 8 pages.
Communication pursuant to Article 94(3) EPC dated Jun. 15, 2016 in connection with European Patent Application No. 15 150 898.3.

* cited by examiner

*Primary Examiner* — Edward Tso
*Assistant Examiner* — Ahmed Omar

(57) ABSTRACT

Various embodiments of this disclosure provide a power source management method and apparatus of an electronic device. The power source management apparatus of the electronic device includes a memory for storing a battery consumption pattern by situation and a battery charging pattern by situation. A controller is configured to collect at least one of situation information or information for life pattern judgment. The controller is also configured to predict a situation of the electronic device or a life pattern using the collection information and judge a chargeability of a battery. The situation is related with at least one or more of a location and a time.

18 Claims, 16 Drawing Sheets

| LOCATION | CHARGING AMOUNT | CHARGING TIME | CHARGING TYPE |
|---|---|---|---|
| "A" | 20% | 30m | Q (Quick) |
| "B" | 30% | 1H | "O" (Ordinary) |
| "C" | 5% | 10m | "O" (Ordinary) |
| ⋮ | ⋮ | ⋮ | ⋮ |

FIG.7A

| ITEM | TIME |
|---|---|
| CONFERENCE | 13:00~17:00 |
| MEETING | 18:00~19:00 |
| MOVIE | 22:00~24:00 |
| ⋮ | ⋮ |

FIG.8A

| PATTERN | TIME |
|---|---|
| EXERCISE | 08:00~09:00 |
| EATING | 12:00~13:00 |
| GOING TO BED | 22:00~07:00 |
| ⋮ | ⋮ |

FIG.9A

METHOD FOR CONTROLLING AND AN ELECTRONIC DEVICE THEREOF

PRIORITY

The present application is related to and claims priority under 35 U.S.C. §119(a) to a Korean Patent Application filed in the Korean Intellectual Property Office on Jan. 14, 2014 and assigned Serial No. 10-2014-0004660, the contents of which are herein incorporated by reference.

TECHNICAL FIELD

The present disclosure relate to an apparatus and method for battery management in the electronic device.

BACKGROUND

In recent years, electronic devices having convergence functions of conducting one or more functions in a manifold fashion are increasing little by little. Further, the main stream of the electronic devices is mobile terminals roughly classified into so-called 'smart phones'. The mobile terminals have large-screen touch display modules, and have high-pixel camera modules to provide functions of taking pictures and videos besides basic functions of communication with the other party. Also, the mobile terminals can play multimedia contents such as music, video and the like, and can also connect to a network to perform web surfing. These mobile terminals gradually have high-performance processors, thereby being able to perform a variety of convergence functions.

These electronic devices can use power source supply means called batteries. Due to the advance of the electronic devices, batteries of larger capacities are being used.

Because the batteries have limited capacities, the batteries are charged, thereby being able to increase a use time of the electronic devices.

In general, the electronic devices can indicate battery levels. For example, the electronic devices can indicate the battery levels by numerical values, and can process to decrease the numerical values of the battery levels in accordance to battery consumption.

SUMMARY

According to the conventional art, electronic devices can output information in order for users to recognize battery levels.

For example, the electronic devices can indicate the battery levels by numerical values. If the battery levels of threshold values or less are checked, the electronic devices can output messages of notifying that battery charging is desired.

According to various example embodiments, the electronic device may provide an apparatus and method for judging a situation in which battery charging is desired on the basis of one of a battery consumption pattern, a battery charging pattern, and a user's life pattern.

According to various example embodiments, the electronic device may provide an apparatus and method for predicting a battery use time on the basis of a battery consumption pattern, a battery charging pattern, and a user's life pattern.

According to one aspect of the present disclosure, an electronic device is provided, which includes a memory for storing a battery consumption pattern by situation and a battery charging pattern by situation. The electronic device also includes a controller configured to collect situation information or information for life pattern judgment and a judgment module configured to predict a situation of the electronic device or a life pattern using the collection information and judge a chargeability of a battery. The situation is related with at least one or more of a location and a time.

To address the above-discussed deficiencies, it is a primary object to provide a method is provided for creating a binary code in an electronic device. The method includes collecting situation information or information for life pattern judgment and predicting a situation of the electronic device or a life pattern using the collection information and judging a chargeability of a battery.

According to another aspect of the present disclosure, a non-transitory computer readable medium is provided embodying a computer program. The computer program includes computer readable program code for collecting situation information or information for life pattern judgment in an electronic device. The computer program also includes computer readable program code for predicting a situation of the electronic device or a life pattern using the collection information. The computer program also includes computer readable program code for judging a chargeability of a battery.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 7A to FIG. 7D illustrate diagrams showing an operation of an electronic device according to various example embodiments of the present disclosure;

FIG. 8A and FIG. 8B illustrate diagrams showing an operation of an electronic device according to various example embodiments of the present disclosure;

FIG. 9A to FIG. 9C illustrate diagrams showing an operation of an electronic device according to various example embodiments of the present disclosure.

DETAILED DESCRIPTION

Figure 1:
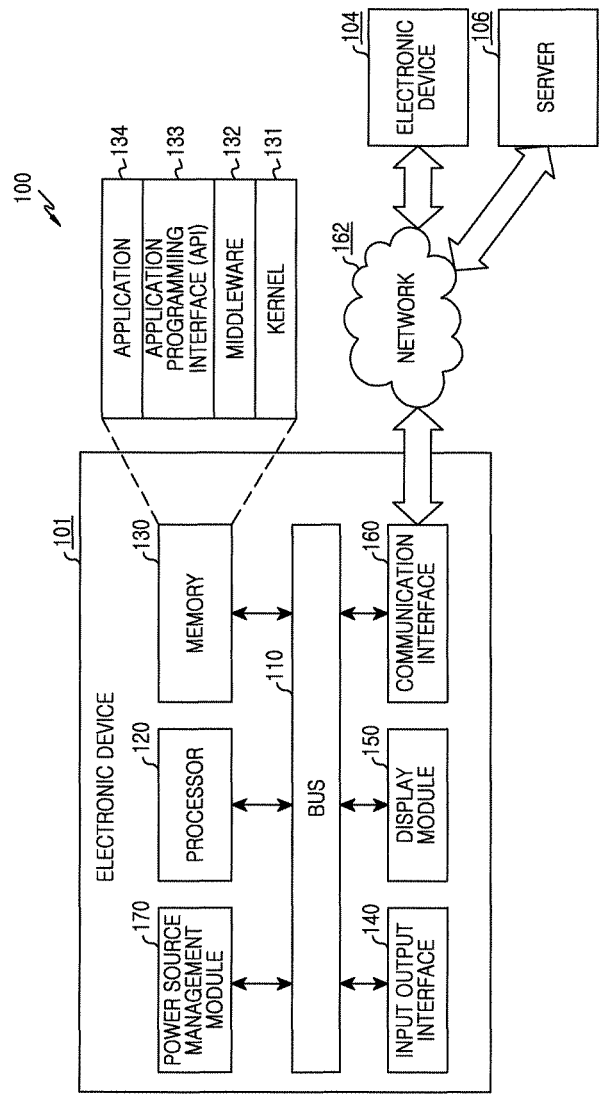
FIG. 1 illustrates a network environment including an electronic device according to various example embodiments.

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system and method. The present disclosure is described below with reference to the accompanying drawings. The present disclosure may make various modifications and provide several example embodiments. Specific example embodiments are illustrated in the drawings and a related detailed description is stated. But, it should be understood that the present disclosure does not intend to be limited to a specific embodiment form, and includes all modifications and/or equivalents or substitutes included in the spirit and technological scope of the present disclosure. In relation to a description of the drawing, like constituent elements are denoted by like reference symbols.

The expressions "comprise", "may comprise" and the like usable in the present disclosure indicate the existence of disclosed corresponding functions, operations, constituent elements and the like, and do not limit additional one or more functions, operations, constituent elements and the like. Also, in the present disclosure, it should be understood that the terms "comprise", "have" and the like are to designate the existence of features stated in the specification, numerals, steps, operations, constituent elements, components, or a combination of them, and are not to previously exclude the possibility of existence or addition of one or more other features, numerals, steps, operations, constituent elements, components, or a combination of them.

In the present disclosure, the expressions such as "or" and the like include any and all combinations of words enumerated together. For example, the expression "A or B" may include "A" or may include "B" or may also include all "A" and "B".

In the present disclosure, the expressions such as "1st", "2nd", "first", "second" and the like may modify various constituent elements of the present disclosure, but do not intend to limit the corresponding constituent elements. For example, the expressions do not limit the order and/or importance and the like of the corresponding constituent elements. The expressions may be used to distinguish one constituent element from another constituent element. For example, a 1st user device and a 2nd user device are all user devices, and represent different user devices. For example, a 1st constituent element may be named as a 2nd constituent element without departing from the scope of right of the present disclosure. Likely, even a 2nd constituent element may be named as a 1st constituent element.

When it is mentioned that any constituent element is "coupled" or "connected" to another constituent element, it should be understood that the any constituent element may be directly coupled or connected to the another constituent element or the third constituent element may also exist between the any constituent element and the another constituent element. Alternatively, when it is mentioned that any constituent element is "directly coupled" or "directly connected" to another constituent element, it should be understood that the third constituent element does not exist between the any constituent element and the another constituent element.

The terms used in the present disclosure are used to just describe a specific example embodiment, and do not intend to limit the present disclosure. The expression of singular number includes the expression of plural number unless the context clearly dictates otherwise.

Unless defined otherwise, all the terms used herein including the technological or scientific terms have the same meaning as those commonly understood by a person having ordinary knowledge in the art which the present disclosure belongs to. The terms as defined in a general dictionary should be interpreted as having the same meanings as the contextual meanings of a related technology, and are not interpreted as having ideal or excessively formal meanings unless defined clearly in the present disclosure.

An electronic device according to the present disclosure may be a device including a communication function. For example, the electronic device may include a smart phone, a tablet Personal Computer (PC), a mobile phone, a video phone, an electronic book (e-book) reader, a desktop PC, a laptop PC, a netbook computer, a Personal Digital Assistant (PDA), a Portable Media Player (PMP), an MPEG Audio Layer 3 (MP3) player, a mobile medical instrument, a camera, or a wearable device (e.g., at least one of a Head Mounted Display (HMD) such as electronic glasses, electronic clothes, an electronic bracelet, an electronic necklace, an appcessory, an electronic tattoo, or a smart watch).

According to some example embodiments, the electronic device may be smart electronic home appliances having a communication function. The smart electronic home appliances may include, for example, at least one of a television, a Digital Versatile Disc (DVD) player, an audio system, a refrigerator, an air conditioner, a cleaner, an oven, a microwave, a washing machine, an air cleaner, a set-top box, a TV box (for example, Samsung HomeSync™, Apple TV™, or Google TV™), a game console, an electronic dictionary, an electronic locking system, a camcorder, or an electronic frame.

According to some example embodiments, the electronic device may include at least one of various medical instruments (e.g., Magnetic Resonance Angiography (MRA), Magnetic Resonance Imaging (MRI), Computerized Tomography (CT), a moving-camera, an ultrasound machine and the like), a navigation device, a Global Positioning System (GPS) receiver, an Event Data Recorder (EDR), a Flight Data Recorder (FDR), a car infotainment device, an electronic equipment for ship (e.g., a navigation device for ship, a gyrocompass and the like), avionics, or a security instrument.

According to some example embodiments, the electronic device may include at least one of a part of furniture or building/structure including a communication function, an electronic board, an electronic signature input device, a projector, or various metering instruments (e.g., tap water, electricity, gas or radio wave metering instrument or the like). The electronic device according to the present disclosure may be one of the aforementioned various devices or a combination of them. Also, it is obvious to those skilled in the art that the electronic device according to the present disclosure is not limited to the aforementioned instruments.

Below, an electronic device according to various example embodiments will be described with reference to the accompanying drawings. The term 'user' used in various example embodiments may denote a person who uses the electronic device or a device (e.g., an artificial intelligent electronic device) which uses the electronic device.

FIG. 1 illustrates a network environment 100 including an electronic device 101 according to various example embodiments.

Referring to FIG. 1, the electronic device 101 may include a bus 110, a processor 120, a memory 130, an input/output interface 140, a display module 150, a communication interface 160, and a power source management module 170.

The bus 110 may be a circuit coupling the aforementioned constituent elements with one another and forwarding communication (e.g., a control message) between the aforementioned constituent elements.

The processor 120 may, for example, receive instructions from the aforementioned other constituent elements (e.g., the memory 130, the input/output interface 140, the display module 150, the communication interface 160, the power source management module 170 or the like) through the bus 110, and decipher the received instructions, and execute operation or data processing according to the deciphered instructions.

The memory 130 may store an instruction or data that is received from the processor 120 or the other constituent elements (e.g., the input/output interface 140, the display module 150, the communication interface 160, the power source management module 170 or the like) or is generated by the processor 120 or the other constituent elements. The memory 130 may, for example, include programming modules such as a kernel 131, a middleware 132, an Application Programming Interface (API) 133, an application 134 or the like. The aforementioned programming modules each may be comprised of software, firmware, hardware or a combination of at least two or more of them.

The kernel 131 may control or manage system resources (e.g., the bus 110, the processor 120, the memory 130 or the like) used for executing operations or functions implemented by the remnant other programming modules, for example, the middleware 132, the API 133, or the application 134. Also, the kernel 131 may provide an interface enabling the middleware 132, the API 133, or the application 134 to connect and control or manage the individual constituent element of the electronic device 101.

The middleware 132 may perform a relay role of enabling the API 133 or the application 134 to communicate and exchange data with the kernel 131. Also, in relation to work requests received from the application 134, the middleware 132 may, for example, perform control (e.g., scheduling or load balancing) for the work requests using a method of allocating at least one application among the applications 134 priority order capable of using the system resources (e.g., the bus 110, the processor 120, the memory 130 or the like) of the electronic device 101.

The API 133 is an interface enabling the application 134 to control a function provided by the kernel 131 or the middleware 132. The API 133 may, for example, include at least one interface or function (e.g., instruction) for file control, window control, picture processing, character control or the like.

According to various example embodiments, the application 134 may include a Short Message Service (SMS)/Multimedia Message Service (MMS) application, an electronic mail (e-mail) application, a calendar application, an alarm application, a health care application (e.g., an application measuring momentum, blood sugar or the like), environment information application (e.g., an application providing air pressure, humidity, temperature information or the like) or the like. Additionally or alternatively, the application 134 may be an application related with information exchange between the electronic device 101 and an external electronic device (e.g., an electronic device 104). The application related with the information exchange may include, for example, a notification relay application for relaying specific information to the external electronic device, or a device management application for managing the external electronic device.

For example, the notification relay application may include a function of relaying to the external electronic device (e.g., the electronic device 104) notification information generated in other applications (e.g., the SMS/MMS application, the e-mail application, the health care application, the environment information application or the like) of the electronic device 101. Additionally or alternatively, the notification relay application may, for example, receive notification information from the external electronic device (e.g., the electronic device 104) and provide the received notification information to a user. The device management application may, for example, manage (e.g., install, delete or update) a function (e.g., turn-on/turn-off of the external electronic device itself (or some constituent components), or adjustment of a brightness or resolution of a display) of at least a part of the external electronic device (e.g., the electronic device 104) communicating with the electronic device 101, an application operating in the external electronic device, or a service (e.g., a call service or a message service) provided in the external electronic device.

According to various example embodiments, the application 134 may include an application designated according to an attribute (e.g., the kind of electronic device) of the external electronic device (e.g., the electronic device 104). For example, when the external electronic device is an MP3 player, the application 134 may include an application related with music playback. Similarly, when the external electronic device is a mobile medical instrument, the application 134 may include an application related with health care. According to one example embodiment, the application 134 may include at least one of an application designated to the electronic device 101 or an application received from the external electronic device (e.g., the server 106 or the electronic device 104).

The input/output interface 140 may forward an instruction or data, which is inputted from a user through an input/output device (e.g., a sensor, a keyboard or a touch screen), for example, to the processor 120, the memory 130, the communication interface 160, or the power source management module 170 through the bus 110. For example, the input/output interface 140 may provide data about a user's touch inputted through the touch screen, to the processor 120. Also, the input/output interface 140 may, for example, output through the input/output device (e.g., a speaker or a display) an instruction or data which is received from the processor 120, the memory 130, the communication interface 160, or the power source management module 170 through the bus 110. For example, the input/output interface 140 may output voice data, which is processed through the processor 120, to the user through the speaker.

The display module 150 may display a variety of information (e.g., multimedia data, text data, or the like) to a user.

The communication interface 160 may establish communication between the electronic device 101 and the external device (e.g., the electronic device 104 or the server 106). For example, the communication interface 160 may be coupled to a network 162 through wireless communication or wired communication and communicate with the external device. The wireless communication can, for example, include at least one of Wireless Fidelity (WiFi), Bluetooth (BT), Near Field Communication (NFC), Global Positioning System (GPS) or cellular communication (e.g., Long Term Evolution (LTE), LTE-Advanced (LTE-A), Code Division Multiple Access (CDMA), Wireless CDMA (WCDMA), Universal Mobile Telecommunication System (UMTS), Wireless Broadband (WiBro), Global System for Mobile Communications (GSM), or the like). The wired communication can, for example, include at least one of a Universe Serial Bus (USB), a High Definition Multimedia Interface (HDMI), a Recommended Standard-232 (RS-232), or a Plain Old Telephone System (POTS).

According to one example embodiment, the network 162 may be a telecommunication network. The telecommunication network may include at least one of a computer network, the Internet, the Internet of things or a telephone network. According to one example embodiment, a protocol (e.g., a transport layer protocol, a data link layer protocol or a physical layer protocol) for communication between the electronic device 101 and the external device may be supported in at least one of the application 134, the application programming interface 133, the middleware 132, the kernel 131, or the communication interface 160.

According to one example embodiment, the power source management module 170 may, for example, judge a necessity of battery charging on the basis of at least one of a battery charging pattern, a battery consumption pattern, and a user's life pattern.

According to one example embodiment, after storing a charging time, charging type and the like by charging location, the power source management module 170 may predict an amount, time and the like chargeable in a corresponding location and judge that battery charging is possible. According to another example embodiment, after storing information about a battery consumption amount by location, the power source management module 170 may predict a battery amount available in a corresponding location and judge that battery charging is desired. According to a further example embodiment, the power source management module 170 may predict a user's behavior through interworking with a scheduling function, and judge that battery charging is desired.

The power source management module 170 is described below in detail in FIG. 2.

Figure 2:
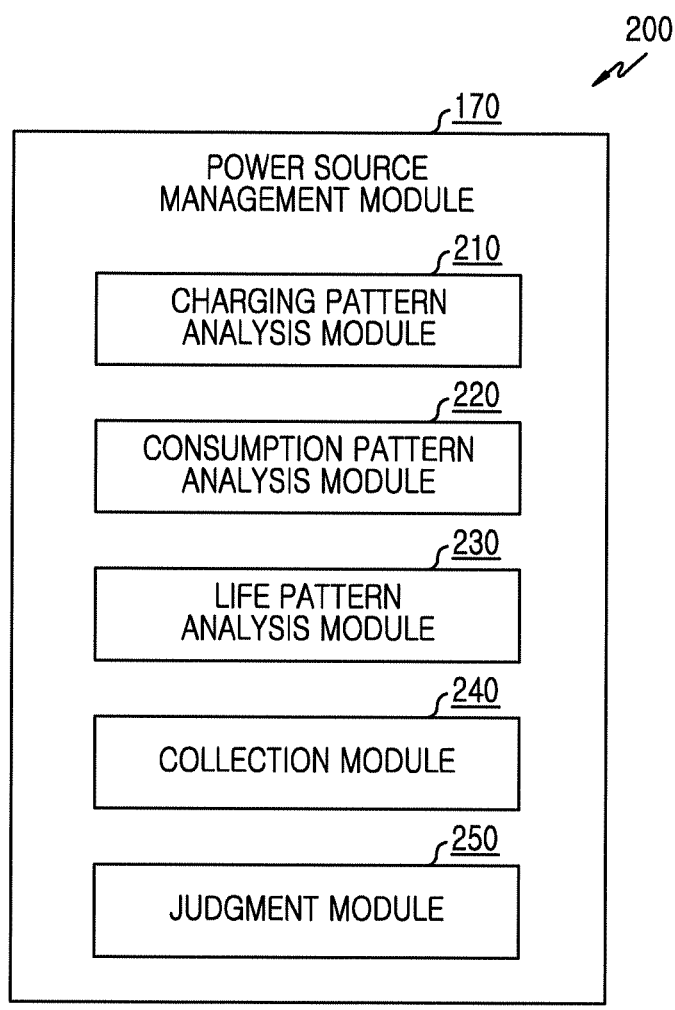
FIG. 2 illustrates a diagram showing a construction of a power source management module according to various example embodiments of the present disclosure.

FIG. 2 is a diagram illustrating a construction of a power source management module according to various example embodiments of the present disclosure.

Referring to FIG. 2, the power source management module (e.g., the power source management module 170 of FIG. 1) may include a charging pattern analysis module 210, a consumption pattern analysis module 220, a life pattern analysis module 230, a collection module 240, and a judgment module 250. The different modules may be controlled by or part of a controller or processor.

The charging pattern analysis module 210 may analyze a battery charging pattern. According to one example embodiment, the charging pattern analysis module 210 may analyze a battery charging pattern dependent on a situation. Here, the situation may include a charging location. For example, the charging pattern analysis module 210 may analyze information about a charging time (e.g., a charging start time, a charging end time, a charging progress time and the like), charging type (for example, quick charging and general charging), and charging capacity for a location in which a charging operation is sensed.

For example, if a charger is coupled, the charging pattern analysis module 210 may acquire time information, location information and the like to check situation information (for example, a charging location), and may check and store capacity information of the coupled charger, a battery level of a time point at which the charger is coupled, and the like. Further, if the charger is decoupled, the charging pattern analysis module 210 may check time information (i.e., the charging end time), a battery level of a time point at which the charger is decoupled, and the like. According to one example embodiment, the charging pattern analysis module 210 may check a charging time of a battery on the basis of the charging start time and the charging end time, and may check a charging amount of the battery and the like using a change of the battery level, and may also store these as pattern information about a checked situation. Further, the charging pattern analysis module 210 may check a charging type of the battery on the basis of the capacity information of the charger, and may also store this as the pattern information about the checked situation.

The consumption pattern analysis module 220 may analyze a battery consumption pattern. According to one example embodiment, the consumption pattern analysis module 220 may analyze a battery consumption pattern dependent on a situation. Here, the situation may include a battery consumption generation time and place, and an execution of a function generating battery consumption. According to one example embodiment, if a battery consumption of a threshold value or more is generated, the consumption pattern analysis module 220 may check and store location information, time information, and situation information about a function that is being executed, and may check and store a battery consumption amount of each situation.

The life pattern analysis module 230 may analyze a user's life pattern. Here, the life pattern may include a user' behavior (for example, eating, exercise, going to bed and the like) that is repeated periodically, and a user's behavior (for example, a conference, a meeting and the like) that will be conducted in accordance to a schedule. According to one example embodiment, the life pattern analysis module 230 may analyze the life pattern through interworking with a scheduling function, a health care function (for example, a pedometer function, a calorie counting function and the like), an alarm function and the like. Further, the life pattern analysis module 230 may also check the life pattern on the basis of a battery consumption pattern and a battery charging pattern. For example, the life pattern analysis module 230 may check a user's behavior periodically executing a function generating battery consumption in a specific location or at a specific time.

The collection module 240 may collect at least one of situation information of an electronic device and information for user's life pattern judgment. According to one example embodiment, the collection module 240 may include a module for acquiring location information or time information. According to another example embodiment, the collection module 240 may check a user's life pattern through interworking with a scheduling application, an alarm application, a health care application and the like.

The judgment module 250 may judge a chargeability of a battery on the basis of at least one or more of a previously stored battery charging pattern and consumption pattern, a present situation of the electronic device, and a user's life pattern.

According to one example embodiment, if the judgment module 250 checks that it moves to a location in which battery charging frequently occurs, the judgment module 250 may judge that the battery charging is possible in the moved location on the basis of the battery charging pattern, and judge a charging amount chargeable in the moved location, and judge a charging type available in the moved location.

According to another example embodiment, the judgment module 250 may judge that battery charging is desired before a specific schedule is begun, or judge that the battery charging is possible after the schedule is ended, on the basis of the user's life pattern.

According to various example embodiments, an electronic device may include a memory for storing a battery consumption pattern by situation and a battery charging pattern by situation, a collection module for collecting at least one of situation information or information for life pattern judgment, and a judgment module configured to predict a situation of the electronic device or a life pattern using the collection information and judge a chargeability of a battery.

According to various example embodiments, the situation may be related with at least one or more of a location and a time.

According to various example embodiments, the judgment module may check the battery consumption pattern or battery charging pattern corresponding to the predicted situation.

According to various example embodiments, the judgment module may predict a battery available time on the basis of the battery consumption pattern or battery charging pattern corresponding to the predicted situation.

According to various example embodiments, the battery charging pattern may include a charging type, and the judgment module may judge an available charging type corresponding to the predicted situation.

According to various example embodiments, the battery consumption pattern may include information of an execution application, and the judgment module may judge a chargeability of a battery on the basis of a battery consumption amount of an application corresponding to the predicted situation.

According to various example embodiments, the collection module may collect the information for the life pattern judgment from at least any one application among a scheduling application, an alarm application, and a health care application.

According to various example embodiments, the electronic device may include an output unit for outputting the judgment result of the judgment module.

According to various example embodiments, the outputting unit may output the judgment result using at least any one of a text, a sound, and a vibration.

Figure 3:
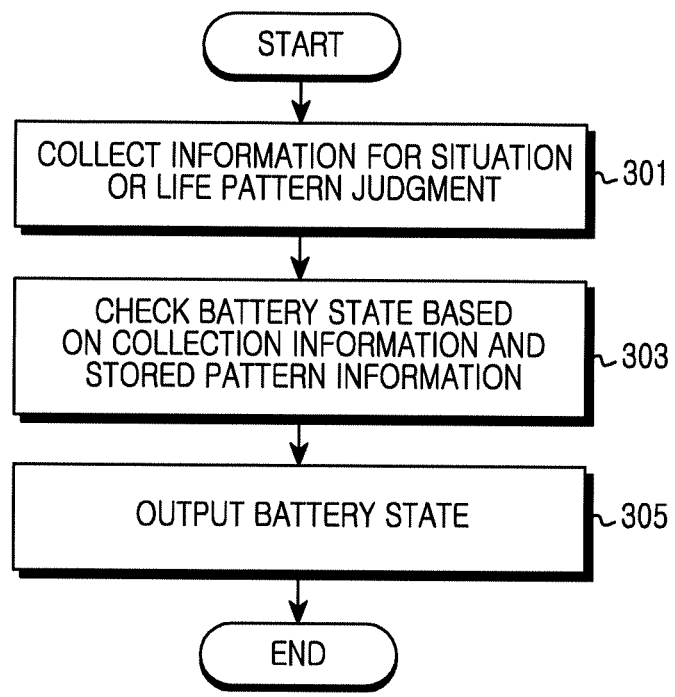
FIG. 3 illustrates a process of an electronic device according to various example embodiments of the present disclosure.

FIG. 3 is a flowchart illustrating an operation of an electronic device according to various example embodiments of the present disclosure.

Referring to FIG. 3, according to various example embodiments of the present disclosure, the electronic device may store at least one or more pattern information among a battery charging pattern and a battery consumption pattern. Here, the battery charging pattern information may include information about a charging time, charging type, and charging amount of a situation (for example, a charging location) in which battery charging is sensed, and the battery consumption pattern information may include a battery consumption generation time and place of a situation in which a battery of a threshold value or more is consumed, and information about a function (e.g., execution application information) generating battery consumption.

In operation 301, the electronic device may collect at least one of information for situation and life pattern judgment. For example, the information for the situation judgment may be location information, time information and the like. The life pattern may include a user's behavior (for example, eating, exercise, going to bed and the like) that is repeated periodically, a user's behavior (for example, a conference, a meeting and the like) that will be conducted in accordance to a schedule, and the information for the life pattern judgment may include interworking information (for example, information acquired through interworking with a scheduling function, an alarm function, a health care function and the like) and the like.

In operation 303, the electronic device may judge a battery state on the basis of the collected information and the previously stored pattern information. Here, the battery state may include a state being chargeable for a present battery.

According to one example embodiment, the electronic device may check pattern information corresponding to a current situation (for example, a location or a moved location, and a time) among the previously stored pattern information, and may judge charging or non-charging of a battery on the basis of the checked pattern information. For example, the electronic device may judge whether it is located in a location in which a charging operation has been frequently performed on the basis of the pattern information, and judge that battery charging in the corresponding location is possible. For another example, the electronic device may judge if it is located in a location of large battery consumption on the basis of the pattern information, and judge if battery charging in the corresponding location is desired.

According to another example embodiment, the electronic device may check the pattern information corresponding to the user's life pattern among the previously stored pattern information, and may judge charging or non-charging of a battery on the basis of the checked pattern information. For example, the electronic device may judge if battery charging is desired before a start of a schedule (e.g., a conference and the like) in which battery charging is unlikely for a predetermined time.

In operation 305, the electronic device may output the judged battery state on the basis of the collected information and the previously stored pattern information. For example, the electronic device may output information notifying a state in which the battery charging is possible or desired at a present time point of the battery.

Figure 4:
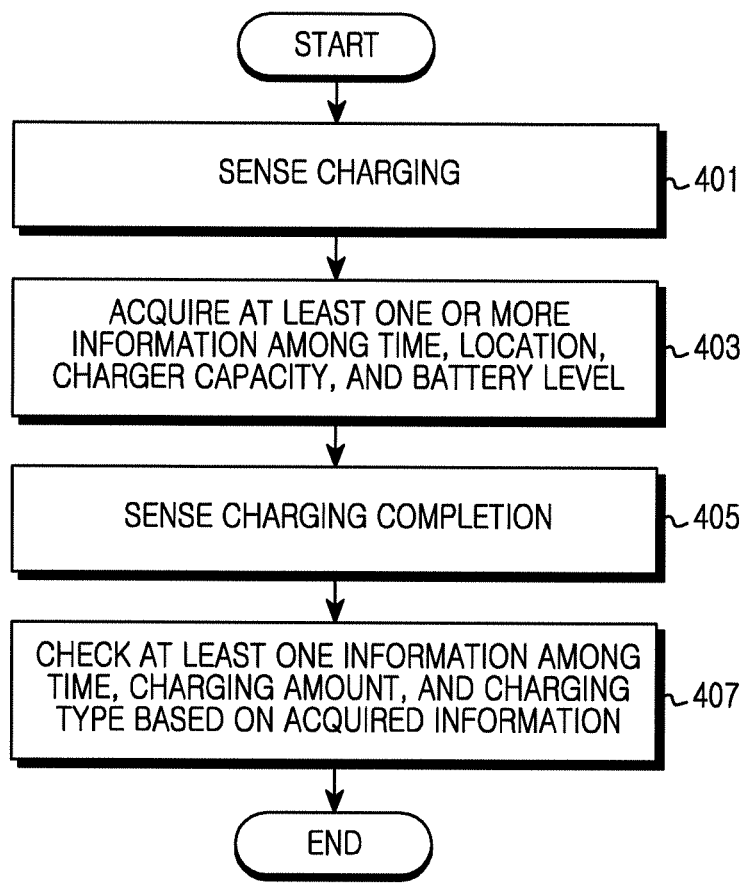
FIG. 4 illustrates a process of an electronic device according to various example embodiments of the present disclosure.

FIG. 4 is a flowchart illustrating an operation of an electronic device according to various example embodiments of the present disclosure.

Referring to FIG. 4, the electronic device may judge a necessity of battery charging on the basis of a battery charging pattern. According to one example embodiment, the electronic device may store information about a battery charging time, charging type, and charging amount by situation.

In operation 401, the electronic device may sense battery charging. According to one example embodiment, the electronic device may sense coupling of a cable for the battery charging.

In operation 403, the electronic device may acquire at least one or more information among time information, location information, charger capacity information, and battery level information of a time point at which the battery charging is sensed.

In operation 405, the electronic device may sense charging completion. According to one example embodiment, the electronic device may check decoupling of the cable for the battery charging, battery full charging, and the like and sense that the battery charging is completed.

In operation 407, the electronic device may check and record (store) information of at least one of a charging time, a charging amount, and a charging type. According to one example embodiment, the electronic device may check the charging amount on the basis of a battery level of the time point at which the battery charging is sensed and a battery level of a time point at which the battery charging is completed.

According to another example embodiment, the electronic device may check the charging time, for example, a time during which the charger is coupled on the basis of the time point at which the battery charging is sensed and the time point at which the battery charging is completed.

According to a further example embodiment, the electronic device may check the charging type (for example, general charging and quick charging) on the basis of a charging capacity of the charging cable coupled for the battery charging.

According to one example embodiment, the electronic device may record the checked charging time, charging amount, and charging type together with a location and a time and manage the recording result as the battery charging pattern by situation.

If the electronic device storing the battery charging pattern by situation as described above checks a location in which the battery charging is possible, the electronic device may output a message of notifying that the battery charging is possible. For example, the electronic device may output a message of notifying that the battery charging is desired before a user moves to a location in which full charging is possible, a location in which charging is possible, and a destination on the basis of a present battery level and a charging amount of a present location.

Figure 5:
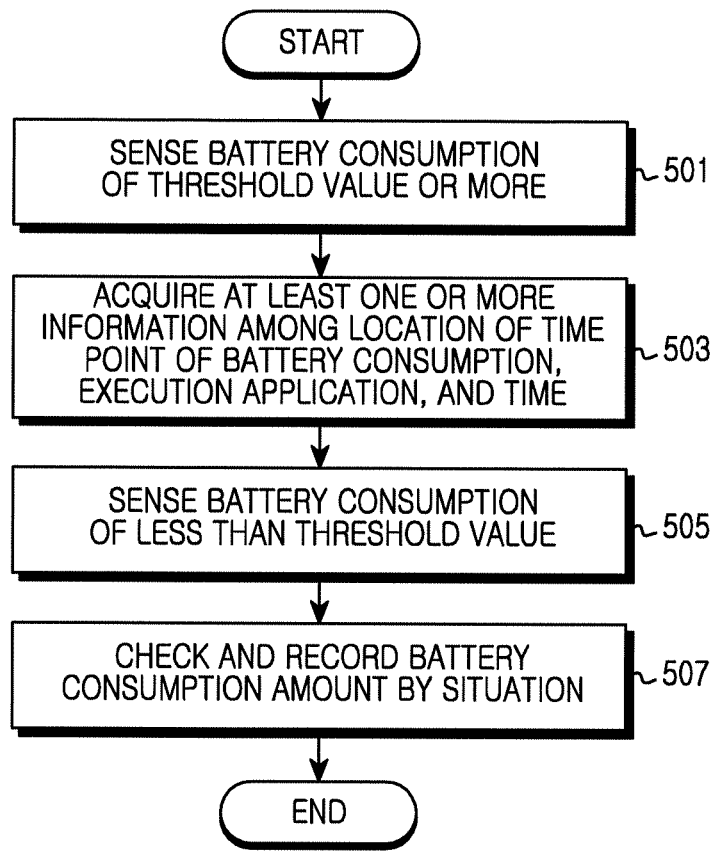
FIG. 5 illustrates a process of an electronic device according to various example embodiments of the present disclosure.

FIG. 5 is a flowchart illustrating an operation of an electronic device according to various example embodiments of the present disclosure.

Referring to FIG. 5, the electronic device may judge a necessity of battery charging on the basis of a battery consumption pattern. According to one example embodiment, the electronic device may store information about battery consumption amounts distinguished by an application, a location, a time and the like.

In operation 501, the electronic device may sense that battery consumption of a threshold value or more is generated.

In operation 503, the electronic device may acquire information of at least one or more of a location, a time, and an execution application of a time point at which it is judged that the battery consumption has been generated.

In operation 505, the electronic device may sense battery consumption of less than the threshold value.

In operation 507, the electronic device may record a battery consumption pattern of a situation in which the battery consumption has been generated. Here, the battery consumption pattern may include location, time information of a time point at which a battery of the threshold value or more is consumed, and may include information about an application generating the battery consumption of the threshold value or more, and a battery consumption amount of each situation.

The electronic device storing the battery consumption pattern by situation as above may predict the battery consumption amount and prevent the battery from being discharged. For example, if a present battery level is less than a battery consumption amount of a present location, the electronic device may output a message of notifying that the battery charging is desired.

Figure 6:
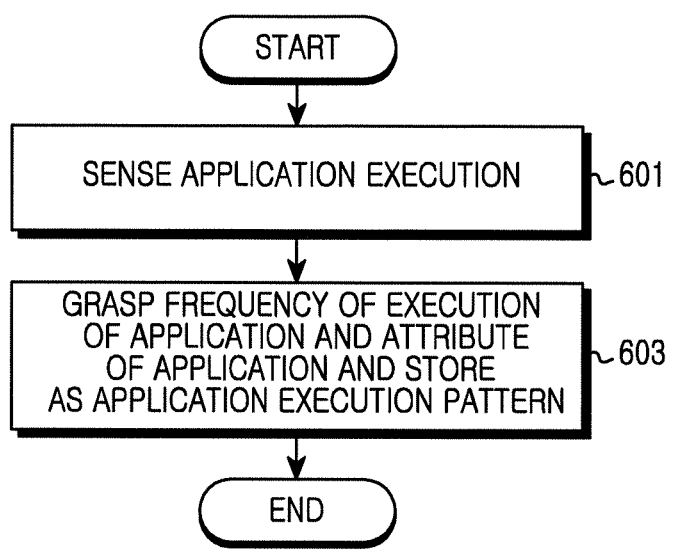
FIG. 6 illustrates a process of an electronic device according to various example embodiments of the present disclosure.

FIG. 6 is a flowchart illustrating an operation of an electronic device according to various example embodiments of the present disclosure.

Referring to FIG. 6, the electronic device may judge a necessity of battery charging on the basis of a user's life pattern. Here, the life pattern may be a user's behavior that is repeated periodically, for example, eating, exercise, going to bed, an application execution pattern and the like. According to various example embodiments of the present disclosure, the electronic device may store information about the application execution pattern.

In operation 601, the electronic device may sense the execution of an application. Here, the application may include contents able to be played back in the electronic device, for example, multimedia data, document data and the like.

In operation 603, the electronic device may grasp at least one or more of a frequency of execution of the application and an attribute of the application, for example, a playback time and a playback period, and store these as the application execution pattern.

For example, if sensing the execution of digital broadcasting, the electronic device may check broadcasting information (i.e., a broadcasting start time, a running time, a follow-up broadcasting schedule and the like) of a corresponding program on the basis of program information (for example, an Electronic Program Guide (EPG)) and store these as a program execution pattern.

The electronic device storing the program execution pattern as above may prevent a battery from being discharged during broadcasting of a corresponding program. For example, if checking that a corresponding program may not be viewed at a present battery level, the electronic device may output a message of notifying that battery charging is desired before the program is begun.

FIG. 7A to FIG. 7D are diagrams illustrating an operation of an electronic device according to various example embodiments of the present disclosure.

The electronic device may store battery charging pattern information dependent on a charging operation. According to one example embodiment, the electronic device may store battery charging pattern information of a situation (i.e., a charging situation) in which coupling of a Travel Adaptor (TA), a charging cable (for example, a USB cable and the like), a wireless charger and the like is sensed. Here, the situation may be a location, a time and the like in which a user periodically conducts a charging operation, and the battery charging pattern information may include a charging amount, a charging time, a charging type and the like.

According to one example embodiment, the charging amount may be a charging amount of a battery charged in a corresponding location, and the charging time may be a period of time charging the battery in the corresponding location. Further, the charging type may be a capacity of a charger, and may be divided into general charging and quick charging in accordance to one example embodiment.

FIG. 7A illustrates battery charging pattern information of a location "A", a location "B", and a location "C".

Referring to FIG. 7A, the electronic device may check if it has performed a charging operation of charging a battery by 20% during 30 minutes using a charger in which quick charging is possible in the location "A". According to one example embodiment, if the electronic device performs a plurality of charging operations in the location "A", the charging amount, charging time, and charging type of the location "A" may include average information.

The electronic device may judge a necessity of battery charging in a corresponding location on the basis of the stored battery charging pattern information.

According to one example embodiment, the electronic device may judge a situation in which battery charging is desired or a situation in which the battery charging is possible on the basis of location information (for example, a present location, a destination location and the like) and the previously stored battery charging pattern information.

Figure 7B:
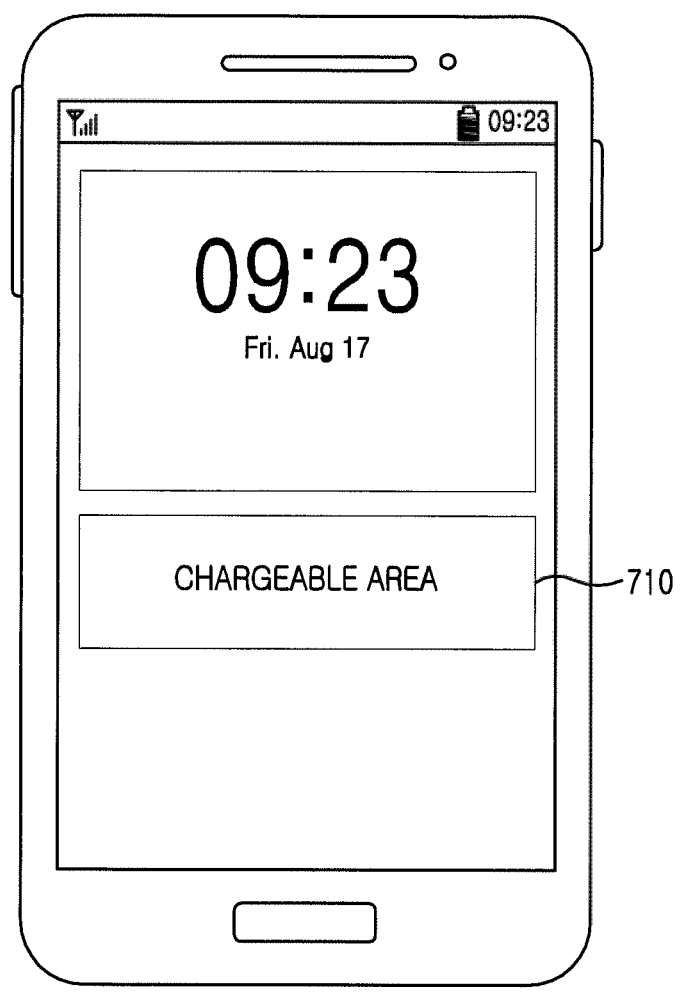

As illustrated in FIG. 7B, if the electronic device checks that it moves to a location included in the battery charging pattern information on the basis of the location information, the electronic device may output charging notification information 710 on the basis of the location information. Here, the charging notification information is a message of notifying that battery charging is possible in a present location. The electronic device may output the charging notification information using a text, a sound, a vibration and the like.

According to another example embodiment, the electronic device may judge the situation in which the battery charging is desired on the basis of the location information and the previously stored battery charging pattern information, for example, charging amount information.

Figure 7C:
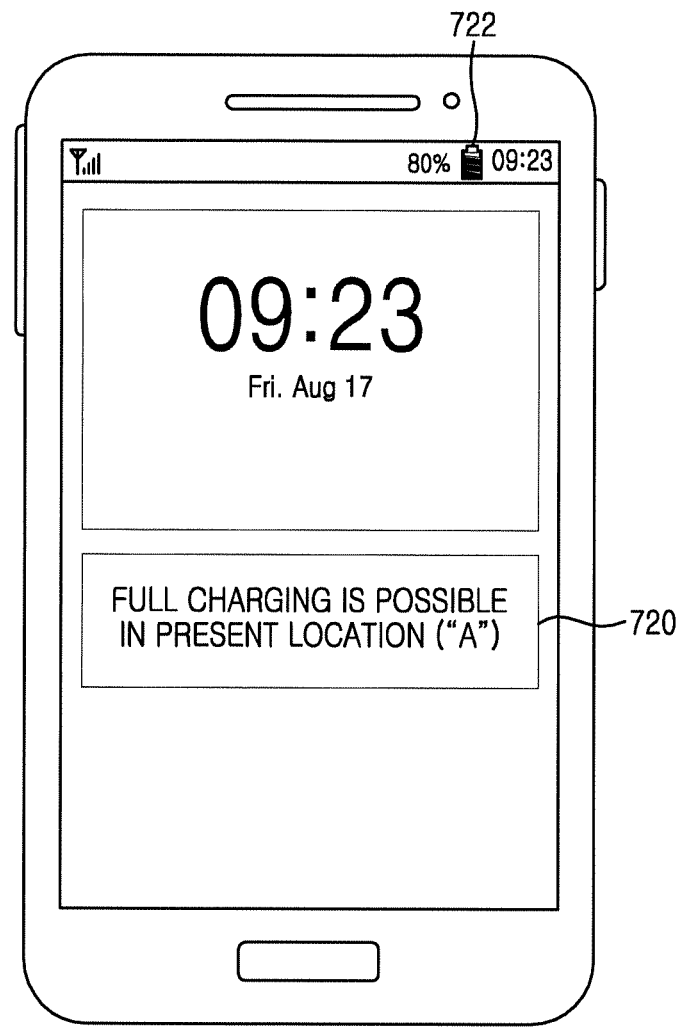

As illustrated in FIG. 7C, if the electronic device checks that it moves to a location included in the battery charging pattern information on the basis of the location information, the electronic device may output charging notification information on the basis of the charging amount information. Here, the charging notification information is a message of notifying a charging amount chargeable in a present location. As illustrated, the electronic device may output charging notification information 720 notifying that full charging is possible in a present location. According to one example embodiment, the electronic device may judge that the full charging is possible on the basis of the previously stored charging amount corresponding to the moved location and a present battery level 722.

According to a further example embodiment, the electronic device may judge a situation in which battery charging is desired on the basis of the location information and the previously stored battery charging pattern information, for example, charging type information.

Figure 7D:
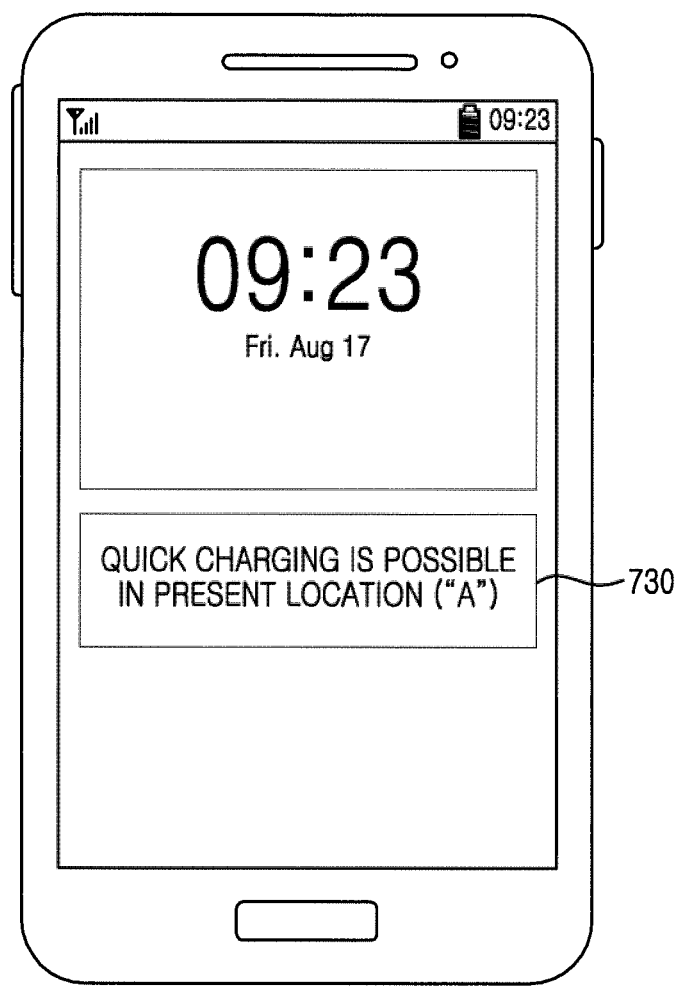

As illustrated in FIG. 7D, if the electronic device checks that it moves to a location included in the battery charging pattern information on the basis of the location information, the electronic device may output charging notification information 730 on the basis of the charging type information. Here, the charging notification information is a message of notifying a charging type in which battery charging is possible in a present location. As illustrated, the electronic device may output charging notification information 730 notifying that quick charging is possible in the present location as moving to a location in which the quick charging is possible.

Figure 8B:
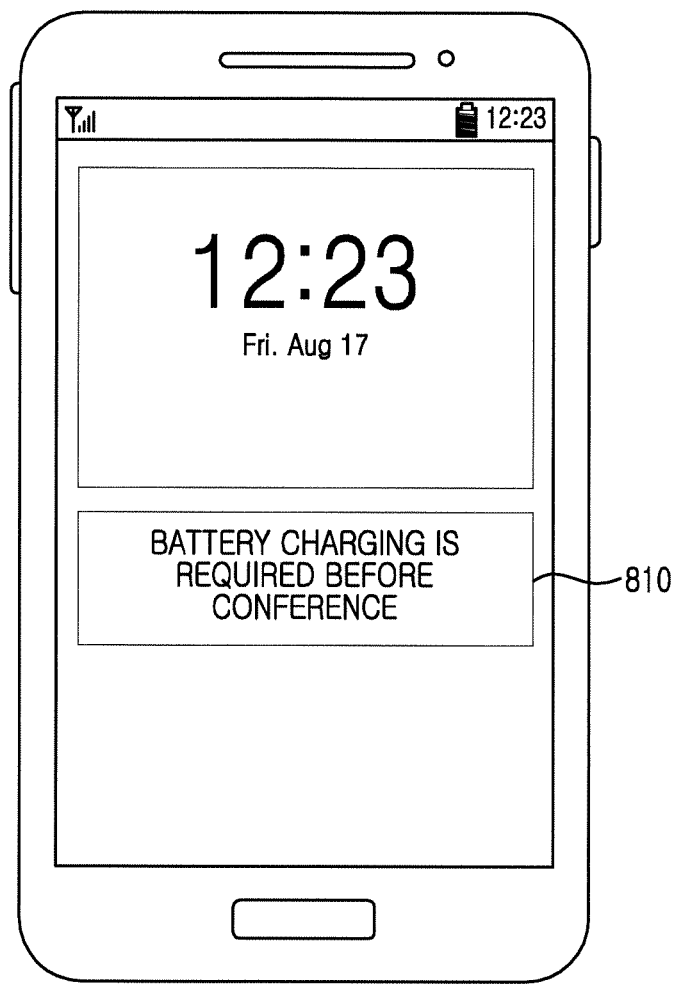

FIG. 8A and FIG. 8B are diagrams illustrating an operation of an electronic device according to various example embodiments of the present disclosure.

The electronic device may check a previously registered user's schedule. According to one example embodiment, the electronic device may predict a user's schedule using a scheduling function, an alarm function, an electronic mail and the like and store the predicted schedule.

FIG. 8A illustrates user's schedule information predicted by the electronic device.

Referring to FIG. 8A, the electronic device may predict user's conference schedule, meeting schedule, movie watching schedule and the like, and judge a necessity of battery charging on the basis of schedule information.

According to one example embodiment, the electronic device may judge a situation in which battery charging is desired on the basis of the predicted schedule and a present battery level. For example, the electronic device may check a user's conference time and, as illustrated in FIG. 8B, the electronic device may output charging notification information 810 notifying that battery charging is desired before conference beginning.

Figure 9B:
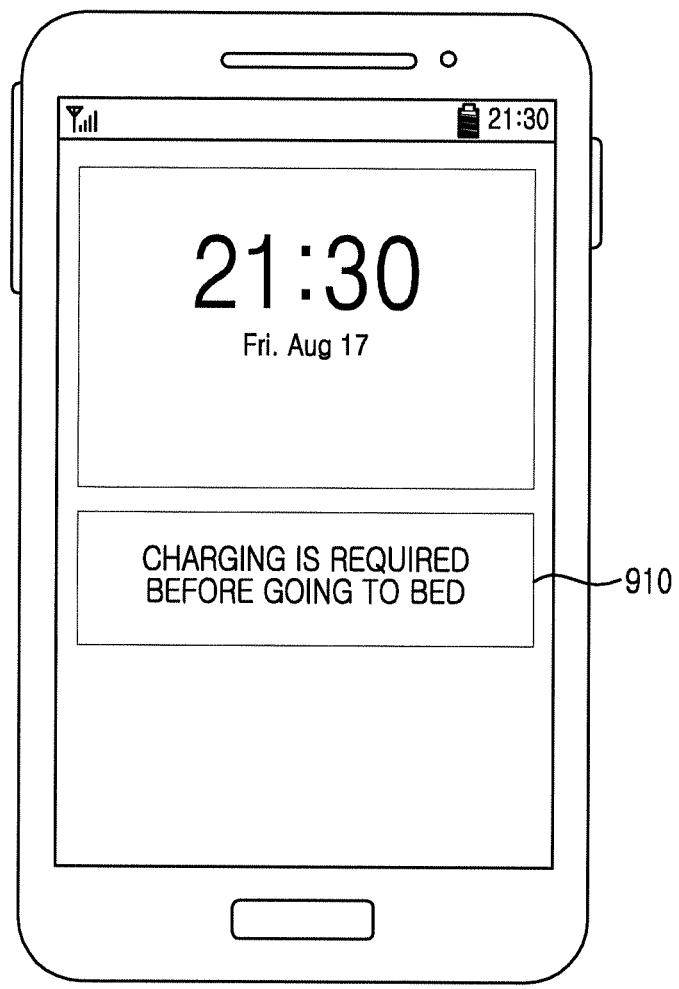
Figure 9C:
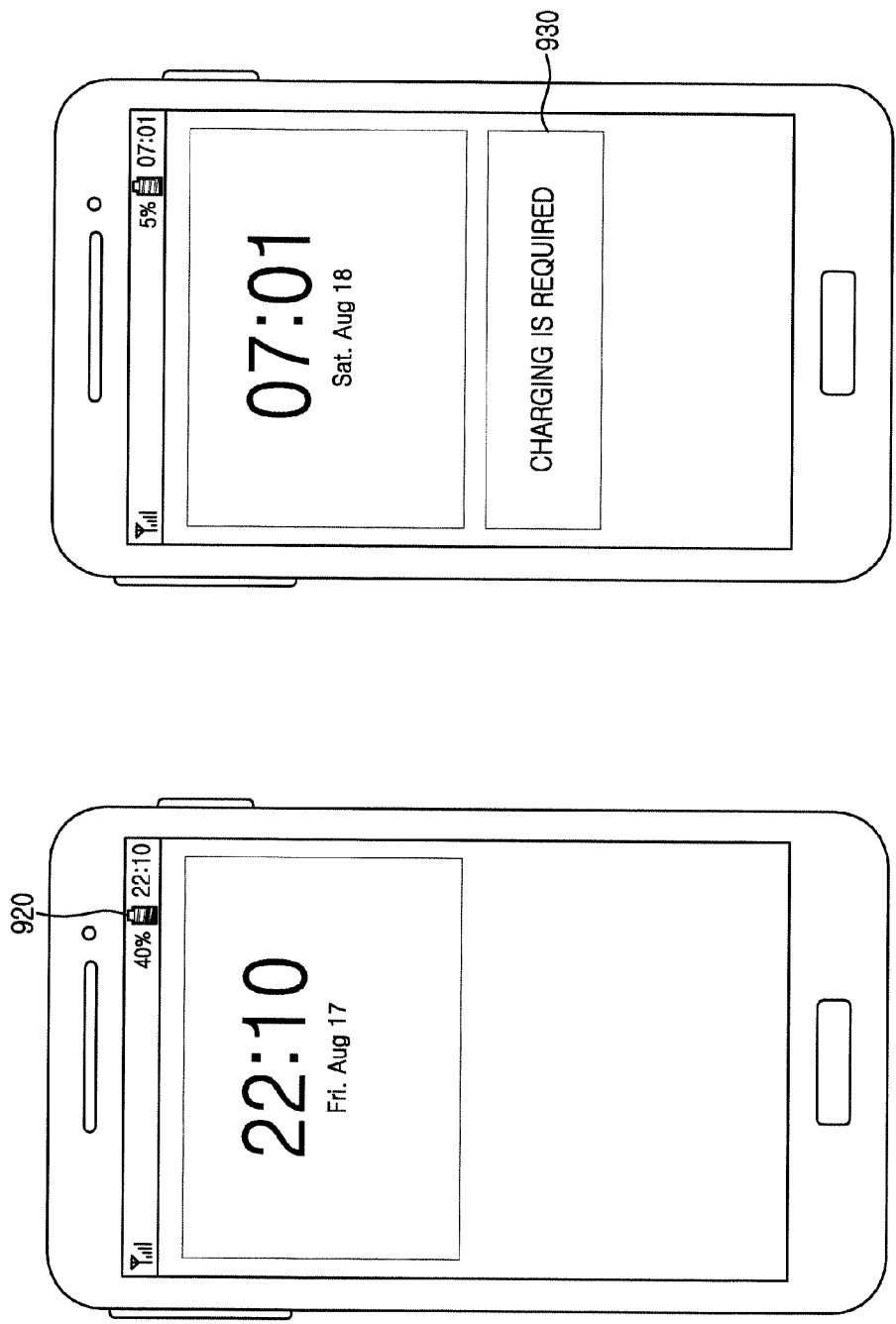

FIG. 9A to FIG. 9C are diagrams illustrating an operation of an electronic device according to various example embodiments of the present disclosure.

The electronic device may check a user's life pattern through interworking with other applications, for example, a scheduling application, a health care application and the like.

FIG. 9A is a diagram illustrating user's life pattern information checked by the electronic device.

Referring to FIG. 9A, the electronic device may judge a life pattern such as user's exercise time, eating time, bedtime and the like, and judge a necessity of battery charging on the basis of the life pattern.

According to one example embodiment, the electronic device may judge a situation in which battery charging is desired on the basis of the judged life pattern and a present battery level. For example, the electronic device may check a user's bedtime and, as illustrated in FIG. 9B, the electronic device may output charging notification information 910 notifying that battery charging is desired before going to bed.

According to another example embodiment, the electronic device may check a user's bedtime and a present battery level. As illustrated in FIG. 9C, the electronic device does not output (920) a battery charging notification during a bedtime (22:00~07:00) although battery charging is possible and, after the bedtime (22:00~07:00) lapses, for example, at 07:01, the electronic device may output a battery charging notification 930.

According to various example embodiments, a power source management method of an electronic device may include the operations of collecting situation information or information for life pattern judgment, and predicting a situation of the electronic device or a life pattern using the collection information and judging a chargeability of a battery.

According to various example embodiments, the power source management method of the electronic device may include the operation of storing a battery consumption pattern or battery charging pattern of a situation related with at least any one of a location or a time.

According to various example embodiments, the operation of storing the battery consumption pattern or battery charging pattern may include the operation of storing a battery consumption pattern or battery charging pattern of a situation related with an execution application.

According to various example embodiments, the operation of judging the chargeability of the battery may include the operation of checking the battery consumption pattern or battery charging pattern corresponding to the predicted situation.

According to various example embodiments, the operation of judging the chargeability of the battery may include the operation of predicting a battery available time on the basis of the battery consumption pattern or battery charging pattern corresponding to the predicted situation.

According to various example embodiments, the battery charging pattern may include a charging type, and the operation of judging the chargeability of the battery may include the operation of judging an available charging type corresponding to the predicted situation.

According to various example embodiments, the operation of collecting the information for the life pattern judgment may include the operation of collecting the information for the life pattern judgment from at least any one application among a scheduling application, an alarm application, and a health care application.

According to various example embodiments, the power source management method of the electronic device may include the operation for outputting the judged chargeability of the battery.

According to various example embodiments, the judgment result may be outputted using at least any one of a text, a sound, and a vibration.

Figure 10:
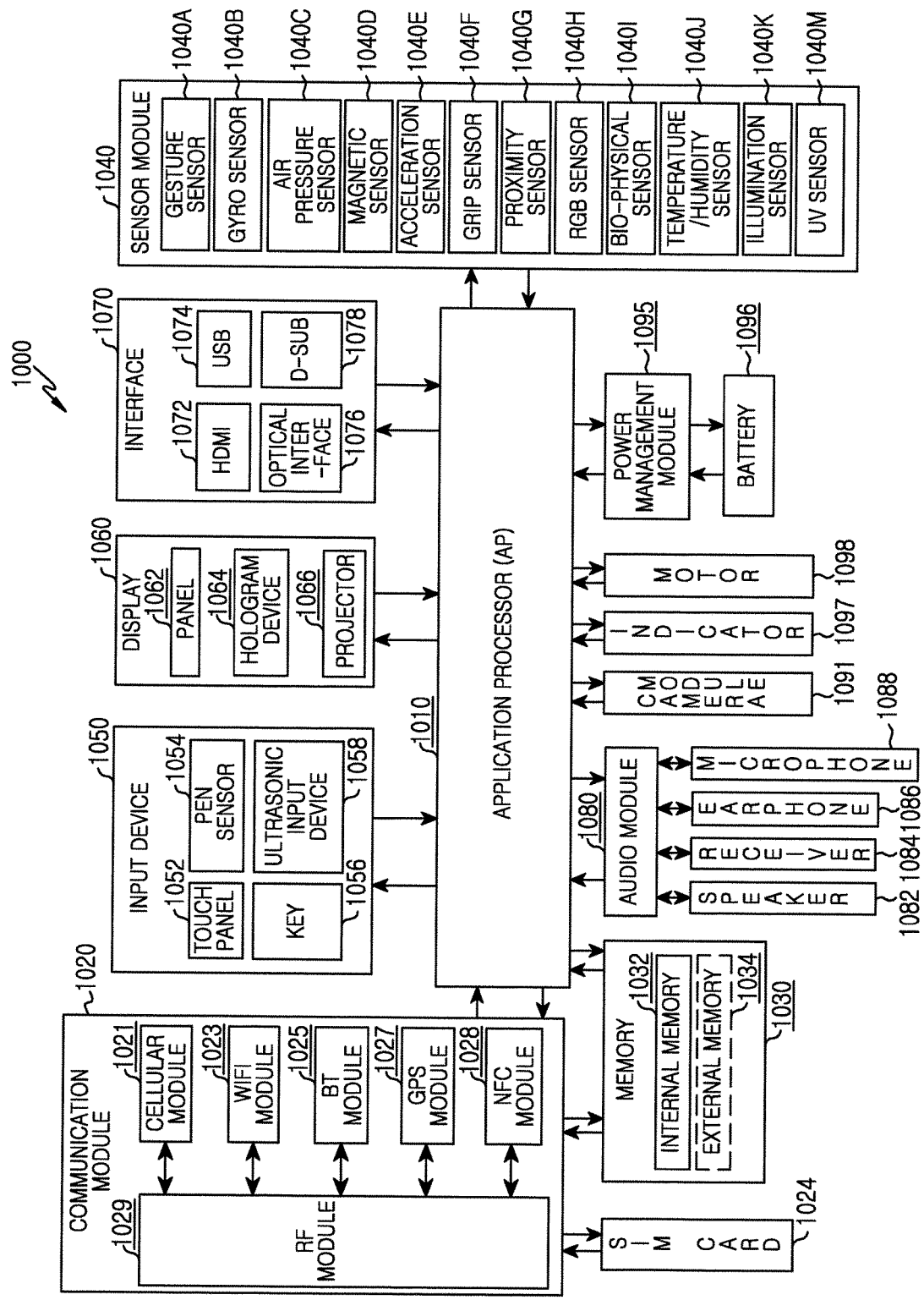
FIG. 10 illustrates a block diagram showing a construction of an electronic device according to various example embodiments.

FIG. 10 is a block diagram illustrating a construction of an electronic device 1000 according to various example embodiments.

The electronic device 1000 may, for example, construct the whole or part of the electronic device 101 illustrated in FIG. 1. Referring to FIG. 10, the electronic device 1000 may include one or more Application Processors (APs) 1010, a communication module 1020, a Subscriber Identification Module (SIM) card 1024, a memory 1030, a sensor module 1040, an input device 1050, a display 1060, an interface 1070, an audio module 1080, a camera module 1091, a power management module 1095, a battery 1096, an indicator 1097, or a motor 1098.

The AP 1010 may drive an operating system or application program and control a plurality of hardware or software constituent elements coupled to the AP 1010. The AP 1010 may perform processing and operation of various data including multimedia data. The AP 1010 may be, for example, implemented as a System on Chip (SoC). According to one example embodiment, the AP 1010 may further include a Graphic Processing Unit (GPU) (not shown).

The communication module 1020 (e.g., the communication interface 160) may perform data transmission/reception in communication between other electronic devices (e.g., the electronic device 104 or the server 106) coupled with the electronic device 1001 (e.g., the electronic device 101) through a network. According to one example embodiment, the communication module 1020 may include a cellular module 1021, a WiFi module 1023, a BT module 1025, a GPS module 1027, an NFC module 1028, and a Radio Frequency (RF) module 1029.

The cellular module 1021 may provide voice telephony, video telephony, a text service, an Internet service or the like through a communication network (e.g., LTE, LTE-A, CDMA, WCDMA, UMTS, WiBro, GSM or the like). Also, the cellular module 1021 may, for example, perform electronic device distinction and authorization within a communication network using a subscriber identification module (e.g., the SIM card 1024). According to one example embodiment, the cellular module 1021 may perform at least some functions among functions that the AP 1010 may provide. For example, the cellular module 1021 may perform at least a part of a multimedia control function.

According to one example embodiment, the cellular module 1021 may include a Communication Processor (CP). Also, the cellular module 1021 can be, for example, implemented as a SoC. In FIG. 10, the constituent elements such as the cellular module 1021 (e.g., the communication processor), the memory 1030, the power management module 1095 or the like are illustrated as constituent elements separate from the AP 1010. However, according to one example embodiment, the AP 1010 may be implemented to include at least some (e.g., the cellular module 1021) of the aforementioned constituent elements.

According to one example embodiment, the AP 1010 or the cellular module 1021 (e.g., the communication processor) may load to a volatile memory an instruction or data received from a nonvolatile memory coupled to each of the AP 1010 and the cellular module 1021 or at least one of other constituent elements, and process the loaded instruction or data. Also, the AP 1010 or the cellular module 1021 may store data received from at least one of other constituent elements or generated in at least one of the other constituent elements, in the nonvolatile memory.

The WiFi module 1023, the BT module 1025, the GPS module 1027, or the NFC module 1028 may each include a processor for processing data transmitted/received through the corresponding module, for example. In FIG. 10, each of the cellular module 1021, the WiFi module 1023, the BT module 1025, the GPS module 1027 or the NFC module 1028 is illustrated as a separate block. But, according to one example embodiment, at least some (e.g., two) of the cellular module 1021, the WiFi module 1023, the BT module 1025, the GPS module 1027 or the NFC module 1028 may be included within one Integrated Circuit (IC) or IC package. For example, at least some processors corresponding to the cellular module 1021, the WiFi module 1023, the BT module 1025, the GPS module 1027 or the NFC module 1028, for example, a communication processor corresponding to the cellular module 1021 and a WiFi processor corresponding to the WiFi module 1023 may be implemented as one SoC.

The RF module 1029 may perform data transmission/reception, for example, RF signal transmission/reception. The RF module 1029 may include, though not illustrated, a transceiver, a Power Amp Module (PAM), a frequency filter, a Low Noise Amplifier (LNA) or the like, for example. Also, the RF module 1029 may further include components, for example, a conductor, a conductive line or the like for transmitting/receiving an electromagnetic wave on a free space in wireless communication. In FIG. 10, it is illustrated that the cellular module 1021, the WiFi module 1023, the BT module 1025, the GPS module 1027, and the NFC module 1028 share one RF module 1029 with each other. But, according to one example embodiment, at least one of the cellular module 1021, the WiFi module 1023, the BT module 1025, the GPS module 1027, or the NFC module 1028 may perform RF signal transmission/reception through a separate RF module.

The SIM card 1024 may be a card including a subscriber identification module, and may be inserted into a slot provided in a specific location of the electronic device 1001. The SIM card 1024 may include unique identification information (e.g., an Integrated Circuit Card ID (ICCID)) or subscriber information (e.g., an International Mobile Subscriber Identity (IMSI)).

The memory 1030 (e.g., the memory 130) may include an internal memory 1032 or an external memory 1034. The internal memory 1032 may, for example, include at least one of a volatile memory (e.g., a Dynamic Random Access Memory (DRAM), a Static RAM (SRAM), a Synchronous Dynamic RAM (SDRAM) and the like) or a nonvolatile memory (e.g., a One-Time Programmable Read Only Memory (OTPROM), a Programmable ROM (PROM), an Erasable and Programmable ROM (EPROM), an Electrically Erasable and Programmable ROM (EEPROM), a mask ROM, a flash ROM, a Not AND (NAND) flash memory, a Not OR (NOR) flash memory and the like).

According to one example embodiment, the internal memory 1032 may be a Solid State Drive (SSD). The external memory 1034 may further include a flash drive, for example, Compact Flash (CF), Secure Digital (SD), micro-SD, Mini-SD, extreme Digital (xD), a memory stick or the like. The external memory 1034 may be functionally coupled with the electronic device 1001 through various interfaces. According to one example embodiment, the electronic device 1001 may further include a storage device (or storage media) such as a hard drive.

The sensor module 1040 may measure a physical quantity or sense an activation state of the electronic device 1001, and convert measured or sensed information into an electrical signal. The sensor module 1040 may, for example, include at least one of a gesture sensor 1040A, a gyro sensor 1040B, an air pressure sensor 1040C, a magnetic sensor 1040D, an acceleration sensor 1040E, a grip sensor 1040F, a proximity sensor 1040G, a color sensor 1040H (e.g., a Red, Green, Blue (RGB) sensor), a bio-physical sensor 1040I, a temperature/humidity sensor 1040J, an illumination sensor 1040K, or a Ultraviolet (UV) sensor 1040M. Additionally or alternatively, the sensor module 1040 may, for example, include an E-nose sensor (not shown), an Electromyography (EMG) sensor (not shown), an Electroencephalogram (EEG) sensor (not shown), an Electrocardiogram (ECG) sensor (not shown), an Infrared (IR) sensor (not shown), an iris sensor (not shown), a fingerprint sensor (not shown) or the like. The sensor module 1040 may further include a control circuit for controlling at least one or more sensors belonging therein.

The input device 1050 may include a touch panel 1052, a (digital) pen sensor 1054, a key 1056, or an ultrasonic input device 1058. The touch panel 1052 may, for example, recognize a touch input in at least one method among a capacitive overlay method, a pressure sensitive method, an infrared beam method, or an acoustic wave method. Also, the touch panel 1052 may also further include a control circuit. In the capacitive overlay method, physical contact or proximity recognition is possible. The touch panel 1052 may also further include a tactile layer. In this embodiment, the touch panel 1052 may provide a tactile response to a user.

The (digital) pen sensor 1054 may be, for example, implemented using a method being the same or similar to a method of receiving a user's touch input or a separate sheet for recognition. The key 1056 may, for example, include a physical button, an optical key, a keypad, or a touch key. The ultrasonic input device 1058 is a device capable of checking data by sensing a sound wave with a microphone (e.g., the microphone 1088) of the electronic device 1001 through an input tool generating an ultrasonic signal. The ultrasonic input device 1058 is possible to perform wireless recognition. According to one example embodiment, by using the communication module 1020, the electronic device 1001 may also receive a user input from an exterior device (e.g., a computer or a server) coupled with the communication module 1020.

The display 1060 (e.g., the display 150) may include a panel 1062, a hologram device 1064, and a projector 1066. The panel 1062 may be, for example, a Liquid Crystal Display (LCD), an Active-Matrix Organic Light-Emitting Diode (AMOLED) or the like. The panel 1062 may be, for example, implemented to be flexible, transparent, or wearable. The panel 1062 may be also constructed together with the touch panel 1052 as one module. The hologram device 1064 may show a three-dimensional image in the air using interference of light. The projector 1066 may display a video by projecting light to a screen. The screen may be, for example, located inside or outside the electronic device 1001. According to one example embodiment, the display 1060 may further include a control circuit for controlling the panel 1062, the hologram device 1064, and the projector 1066.

The interface 1070 may, for example, include an HDMI 1072, a USB 1074, an optical interface 1076, or a D-sub-miniature (D-sub) 1078. The interface 1070 may be, for example, included in the communication interface 160 illustrated in FIG. 1. Additionally or alternatively, the interface 1070 may, for example, include a Mobile High-definition Link (MHL) interface, a Secure Digital/Multi Media Card (SD/MMC) interface, or an Infrared Data Association (IrDA) standard interface.

The audio module 1080 may convert sound and an electric signal interactively. At least some constituent elements of the audio module 1080 may be, for example, included in the input/output interface 140 illustrated in FIG. 1. The audio module 1080 may process sound information inputted or outputted through a speaker 1082, a receiver 1084, an earphone 1086, the microphone 1088, or the like, for example.

The camera module 1091 is a device capable of taking a still picture and a moving picture. According to one example embodiment, the camera module 1091 may include one or more image sensors (e.g., a front sensor or rear sensor), a lens (not shown), an Image Signal Processor (ISP) (not shown), or a flash (not shown) (e.g., an LED or a xenon lamp).

The power management module 1095 may manage electric power of the electronic device 1001. Though not illustrated, the power management module 1095 may include, for example, a Power Management Integrated Circuit (PMIC), a charger Integrated Circuit (IC), or a battery or fuel gauge.

The PMIC may be, for example, mounted within an integrated circuit or a SoC semiconductor. A charging method may be divided into wired and wireless charging methods. The charger IC may charge a battery, and may prevent the introduction of overvoltage or overcurrent from an electric charger. According to one example embodiment, the charger IC may include a charger IC of at least one of the wired charging method or the wireless charging method. As the wireless charging method, there are, for example, a magnetic resonance method, a magnetic induction method, an electromagnetic wave method or the like. Supplementary circuits for wireless charging, for example, circuits such as a coil loop, a resonance circuit, a rectifier or the like may be added.

The battery gauge may, for example, measure a level of the battery 1096, a voltage in charging, an electric current, or a temperature. The battery 1096 may store or generate electricity, and may supply a power source to the electronic device 1001 using the stored or generated electricity. The battery 1096 may, for example, include a rechargeable battery or a solar battery.

The indicator 1097 may display a specific state of the electronic device 1001 or part (e.g., the AP 1010) thereof, for example, a booting state, a message state, a charging state or the like. The motor 1098 may convert an electrical signal into a mechanical vibration. Though not illustrated, the electronic device 1001 may include a processing device (e.g., a GPU) for mobile TV support. The processing device for mobile TV support may process media data according to the standards of Digital Multimedia Broadcasting (DMB), Digital Video Broadcasting (DVB), a media flow or the like, for example.

The aforementioned constituent elements of an electronic device according to the present disclosure may be each comprised of one or more components, and a name of the corresponding constituent element may be different according to the kind of the electronic device. The electronic device according to the present disclosure may include at least one of the aforementioned constituent elements, and may omit some constituent elements or further include additional other constituent elements. Also, some of the constituent elements of the electronic device according to the present disclosure are combined and constructed as one entity, thereby being able to identically perform the functions of the corresponding constituent elements before combination.

The term "module" used in the present disclosure may, for example, represent a unit including one of hardware, software, or firmware or a combination of two or more. The "module" may be used interchangeably with the terms "unit", "logic", "logical block", "component", "circuit" or the like, for example. The "module" may be the minimum unit of an integrally constructed component or part thereof. The "module" may be also the minimum unit performing one or more functions or part thereof. The "module" may be implemented mechanically or electronically. For example, the "module" according to the present disclosure may include at least one of an Application-Specific Integrated Circuit (ASIC) chip, Field-Programmable Gate Arrays (FPGAs) or a programmable logic device performing some operations which have been known to the art or will be developed in the future.

According to various example embodiments, at least a part of an apparatus (e.g., modules or functions thereof) or method (e.g., operations) according to the present disclosure may be, for example, implemented by instructions stored in a computer-readable storage media in a form of a programming module. If the instruction is executed by one or more processors (e.g., the processor 210), the one or more processors may perform functions corresponding to the instructions. The computer-readable storage media may be the memory 1030, for instance. At least a part of the programming module may be, for example, implemented (e.g., executed) by the processor 1010. At least a part of the programming module may, for example, include a module, a program, a routine, a set of instructions, a process or the like for performing one or more functions.

The computer-readable recording media may include magnetic media such as a hard disk, a floppy disk, and a magnetic tape, optical media such as a Compact Disc—Read Only Memory (CD-ROM) and a Digital Versatile Disc (DVD), a Magneto-Optical Media such as a floptical disk, and a hardware device specially configured to store and perform a program instruction (e.g., the programming module) such as a Read Only Memory (ROM), a Random Access Memory (RAM), a flash memory and the like. Also, the program instruction may include not only a mechanical code such as a code made by a compiler but also a high-level language code executable by a computer using an interpreter and the like. The aforementioned hardware device may be constructed to operate as one or more software modules so as to perform operations of the present disclosure, and vice versa.

A module or a programming module according to the present disclosure may include at least one or more of the aforementioned constituent elements, or omit some of the aforementioned constituent elements, or further include additional other constituent elements. Operations carried out by the module, the programming module or the other constituent elements according to the present disclosure may be executed in a sequential, parallel, repeated or heuristic method. Also, some operations may be executed in different order or may be omitted, or other operations may be added.

According to various example embodiments, in a storage media storing instructions, the instructions are set to allow at least one processor to perform at least one operation when being executed by the at least one processor. The at least one operation can include the operation of collecting at least one of situation information or information for life pattern judgment and the operation of predicting a situation of an electronic device or a life pattern using the collected information and judging a chargeability of a battery.

A power source management method and apparatus of an electronic device according to various example embodiments of the present disclosure can, for example, predict a battery use time on the basis of a battery consumption pattern, a user's life pattern and the like, and can accurately judge a situation in which battery charging is desired.

And, example embodiments of the present disclosure disclosed in the specification and the drawings merely suggest specific examples so as to easily describe the technological content of the present disclosure and help the understanding of the present disclosure, and do not intend to limit the spirit and scope of the present disclosure. Accordingly, it should be understood that the scope of the present disclosure includes all modifications or changes drawn on the basis of the technological spirit of the present disclosure as well as the example embodiments disclosed herein.

What is claimed is:

1. An electronic device comprising:
   a battery;
   a memory configured to store usage patterns of the battery; and
   a controller configured to collect situation information and life pattern information, select a battery usage pattern corresponding to the situation information or the life pattern information among the stored usage patterns, and determine a chargeability of the battery using the selected battery usage pattern,
   wherein the usage patterns comprise a consumption pattern and a charging pattern of the battery.

2. The electronic device of claim 1, wherein the controller is further configured to calculate predicted consumption amount of the battery or predicted charge amount of the battery on a basis of the selected battery usage pattern.

3. The electronic device of claim 1, wherein the battery charging pattern of the battery comprises a charging type, and wherein the controller is configured to determine an available charging type corresponding to the situation information.

4. The electronic device of claim 1, wherein the consumption pattern comprises information regarding an application execution, and
wherein the information regarding an application execution comprises at least one of an application type, a battery consumption amount and a battery consumption time.

5. The electronic device of claim 1, wherein the controller is configured to collect the life pattern information from at least one of a scheduling application, an alarm application, and a health care application.

6. The electronic device of claim 1, further comprising an output unit configured to output determined chargeability of the battery.

7. The electronic device of claim 6, wherein the output unit is configured to output the determined chargeability of the battery using at least one of a text, a sound, and a vibration.

8. A power source management method of an electronic device, the method comprising:
collecting situation information and life pattern information;
selecting a battery usage pattern corresponding to the situation information or the life pattern information among stored usage patterns; and
determining a chargeability of a battery using the selected battery usage pattern,
wherein the usage patterns comprise a battery consumption pattern and a battery charging pattern.

9. The method of claim 8, further comprising:
storing the battery usage pattern that is mapped to the situation information and life pattern information,
wherein the situation information comprises at least one of a location or a time.

10. The method of claim 9, wherein determining the chargeability of the battery comprises calculating predicted consumption amount of the battery or predicted charge amount of the battery on a basis of the selected battery usage pattern.

11. The method of claim 9, wherein the battery consumption pattern comprises information regarding an application execution, and
wherein the information of the application execution comprises at least one of an application type, a battery consumption amount and a battery consumption time.

12. The method of claim 9, wherein the battery charging pattern of the battery comprises a charging type, and
wherein determining the chargeability of the battery comprises determining an available charging type corresponding to the situation information.

13. The method of claim 8, wherein collecting life pattern information comprises collecting information from at least one of a scheduling application, an alarm application, and a health care application.

14. The method of claim 8, further comprising:
outputting the determined chargeability of the battery.

15. The method of claim 14, wherein outputting the determined chargeability of the battery is implemented by using at least one of a text, a sound, and a vibration.

16. A non-transitory computer readable medium embodying a computer program, the computer program comprising computer readable program code for:
collecting situation information and life pattern information;
selecting a battery usage pattern corresponding to the situation information or the life pattern information among stored usage patterns; and
determining a chargeability of a battery using the selected battery usage pattern, wherein the usage patterns comprise a battery consumption pattern and a battery charging pattern.

17. The non-transitory computer readable medium of claim 16, further comprising computer readable program code for:
storing a battery usage patterns which are mapped to the situation information and life pattern information,
wherein the battery usage patterns comprise a battery consumption pattern and a battery charging pattern.

18. The non-transitory computer readable medium of claim 17, wherein computer readable program code for storing the battery consumption pattern comprises computer readable program code for storing information regarding at least one of an application type, a battery consumption time and a battery consumption amount.

* * * * *